United States Patent
Wang (10) Patent No.: US 9,588,542 B2
(45) Date of Patent: Mar. 7, 2017

(54) RACK SERVER SYSTEM AND METHOD FOR AUTOMATICALLY MANAGING RACK CONFIGURATION INFORMATION

(71) Applicants: Inventec (Pudong) Technology Corporation, Shanghai (CN); Inventec Corporation, Taipei (TW)

(72) Inventor: Hao-Hao Wang, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 1080 days.

(21) Appl. No.: 13/738,756

(22) Filed: Jan. 10, 2013

(65) Prior Publication Data

US 2014/0074261 A1 Mar. 13, 2014

(30) Foreign Application Priority Data

Sep. 11, 2012 (CN) .......................... 2012 1 0335056

(51) Int. Cl.
*G06F 1/00* (2006.01)
*H05K 7/20* (2006.01)

(52) U.S. Cl.
CPC ........... *G06F 1/00* (2013.01); *H05K 7/20836* (2013.01)

(58) Field of Classification Search
CPC .............................. H05K 7/20836; G06F 1/00
See application file for complete search history.

(56) References Cited

U.S. PATENT DOCUMENTS

| | | | | |
|---|---|---|---|---|
| 6,098,098 A * | 8/2000 | Sandahl | ................ | H04L 41/082 709/221 |
| 7,363,392 B2 * | 4/2008 | Thomas | ................ | G06F 9/4413 710/10 |
| 8,838,286 B2 * | 9/2014 | Florez-Larrahondo | . | G06F 1/206 165/104.33 |
| 8,880,766 B2 * | 11/2014 | Brundridge | ......... | G06F 13/4081 710/304 |
| 2009/0314837 A1 | 12/2009 | Kataoka et al. | | |
| 2010/0169714 A1 | 7/2010 | Takahashi | | |

(Continued)

FOREIGN PATENT DOCUMENTS

| | | |
|---|---|---|
| CN | 101216789 A | 7/2008 |
| CN | 102278321 A | 12/2011 |

(Continued)

*Primary Examiner* — Robert Fennema
*Assistant Examiner* — Fenyang Stewart
(74) *Attorney, Agent, or Firm* — Huffman Law Group, PC (57) ABSTRACT

A rack server system and a method for automatically managing rack configuration information are disclosed herein. The rack server system includes a plurality of servers, plurality of fan modules, a plurality of fan control boards, and a rack management controller. The rack management controller is connected to the fan control boards, detects rack configuration information stored in the fan control boards during the operation of the rack server system, configured to update local rack configuration information stored in the rack management controller with the rack configuration information stored in the fan controllers when the local rack configuration information stored in the rack management controller is different from the rack configuration information stored in the fan control boards.

16 Claims, 2 Drawing Sheets

(56) References Cited

U.S. PATENT DOCUMENTS

| | | | |
|---|---|---|---|
| 2012/0116590 A1 | 5/2012 | Florez-Iarrahondo et al. | |
| 2012/0215359 A1 | 8/2012 | Michael et al. | |
| 2014/0006671 A1* | 1/2014 | Das | H05K 7/1498 |
| | | | 710/305 |

FOREIGN PATENT DOCUMENTS

| | | |
|---|---|---|
| CN | 102478937 A | 5/2012 |
| CN | 102480389 A | 5/2012 |
| TW | 201214138 | 4/2012 |
| TW | 201222221 | 6/2012 |
| TW | 201222265 | 6/2012 |

* cited by examiner

RACK SERVER SYSTEM AND METHOD FOR AUTOMATICALLY MANAGING RACK CONFIGURATION INFORMATION

RELATED APPLICATIONS

This application claims priority to China Application Serial Number 201210335056.3, filed Sep. 11, 2012, which is herein incorporated by reference.

BACKGROUND

Field of Invention

The present disclosure relates to a server system and a method for automatically managing configuration information. More particularly, the present invention relates to a rack server system and a method for automatically managing rack configuration information.

Description of Related Art

With advances in network technology, servers configured to store data, maintain the operations of networks, and provide various network services have become more and more important. A rack server system can pile multiple servers in a rack. Due to the ability of efficient management and heat dissipation, rack server systems are widely used in the apparatus rooms of the enterprises, organizations, and data centers.

The rack server system has a rack management controller (RMC) for managing the operation inside the rack server system, such as rotational speeds of fans in the rack server system. Generally, rack configuration information stored in the rack management controller is entered manually. Therefore, during the operation of the rack server system, if an error, which may be caused by an error of the rack management controller or a replacement of the rack management controller, of the rack configuration information occurred, the rack server system has to be manually set again before it operates correctly. It is inconvenient in managing the servers for the manager, and is difficult to estimate the troubleshooting time when servers fail. As a result, the servers may be out of network services for a long time, or users may be discontented with the network services provided by the servers.

SUMMARY

Therefore, one aspect of the present invention is directed to a rack server system, in which the rack management controller (RMC) inside the rack server system can automatically backup local rack configuration information stored in the rack management controller, such that the rack management controller can automatically recover the original local rack configuration information if the local rack configuration information is damaged or the rack management controller is replaced.

In accordance with one embodiment of the present invention, the rack server system includes a plurality of servers, a plurality of fan modules, a plurality of fan control boards (FCBs), and a rack management controller. The servers are divided into a plurality of groups of servers. Each fan module dissipates the heat of one of the groups of servers corresponding thereto. Each fan control board controls the operation of one of the fan modules corresponding thereto, and communicates with one of the group of servers corresponding to one of the fan modules. The rack management controller is connected to the fan control boards, and detects rack configuration information stored in the fan control boards during the operation of the rack server system, and is configured to update local rack configuration information stored in the rack management controller with the rack configuration information stored in the fan controllers when the local rack configuration information stored in the rack management controller is different from the rack configuration information stored in the fan control boards.

In accordance with one embodiment of the present invention, the rack management controller receives external input rack configuration information via a human machine interface, and stores the external input rack configuration information to the fan control boards and the servers separately.

In accordance with one embodiment of the present invention, when the local rack configuration information stored in the rack management controller is different from the rack configuration information stored in the fan control boards, the rack management controller identifies a largest quantity of identical rack configuration information stored in the fan control boards, and updates the local rack configuration information stored in the rack management controller and the rack configuration information stored in the fan control boards with the largest quantity of identical rack configuration information.

In accordance with one embodiment of the present invention, when the rack management controller does not identify the largest quantity of identical rack configuration information in the fan control boards, the rack management controller receives external input rack configuration information via the human machine interface, and stores the external input rack configuration information, and backs up the external input rack configuration information to the fan control boards as the rack configuration information stored in the fan control boards.

In accordance with one embodiment of the present invention, when the rack management controller has no local rack configuration information, the rack management controller is configured to update itself with the rack configuration information stored in the fan control boards, and to serve the rack configuration information stored in the fan control boards as the local rack configuration information stored in rack management controller.

In accordance with one embodiment of the present invention, when a first fan control board of the fan control boards is new, the rack management controller is configured to update the first fan control board with the local rack configuration information stored in the rack management controller.

In accordance with one embodiment of the present invention, when a first server of the servers is new, the rack management controller updates the first server with the local rack configuration information stored in the rack management controller, or one of the fan control boards corresponding to the first sever updates the first sever with the rack configuration information stored in the corresponding fan control board.

In accordance with one embodiment of the present invention, when the rack management controller detects that the first fan control board or the first server stores another rack configuration information, the rack management controller generates a report according to the another rack configuration information, and then updates the first fan control board or the first server with the local rack configuration information stored in rack management controller.

In accordance with one embodiment of the present invention, the rack configuration information at least comprises rack location information and location information of the servers in a rack of the rack server system.

Another aspect of the present invention is directed to a method for automatically managing rack configuration information. The method can be applied to a rack server system. The rack server system includes a plurality of servers, a plurality of fan control boards, and a rack management controller. The fan control boards are connected to the rack management controller. Utilizing this method can automatically backup local rack configuration information stored in the rack management controller, such that the rack management controller can automatically recover the original local rack configuration information while the local rack configuration information is damaged or the rack management controller is replaced.

In accordance with one embodiment of the present invention, the method for automatically managing rack configuration information includes the following steps: detecting rack configuration information stored in the fan control boards during the operation of the rack server system; and, updating local rack configuration information stored in the rack management controller with the rack configuration information stored in the fan control boards when the local rack configuration information stored in the rack management controller is different from the rack configuration information stored in the fan control boards.

In accordance with one embodiment of the present invention, the method for automatically managing rack configuration information further includes the following step: receiving external input rack configuration information via a human machine interface, and storing the external input rack configuration information to the fan control boards and the servers separately.

In accordance with one embodiment of the present invention, the step of updating the local rack configuration information stored in the rack management controller with the rack configuration information stored in the fan controllers includes the following sub-steps: when the local rack configuration information stored in the rack management controller is different from the rack configuration information stored in the fan control boards, identifying a largest quantity of identical rack configuration information stored in the fan control boards; and, updating the local rack configuration information stored in the rack management controller and the rack configuration information stored in the fan control boards with the largest quantity of identical rack configuration information.

In accordance with one embodiment of the present invention, the step of updating the local rack configuration information stored in the rack management controller with the rack configuration information stored in the fan controllers further includes the following sub-steps: when the largest quantity of identical rack configuration information in the fan control boards is not found in the sub-step abovementioned, receiving external input rack configuration information via the human machine interface and storing the external input rack configuration information; and, backing up the external input rack configuration information to the fan control boards as the rack configuration information stored in the fan control boards.

In accordance with one embodiment of the present invention, the method for automatically managing rack configuration information further includes the following step: when the rack management controller has no local rack configuration information, updating the rack management controller with the rack configuration information stored in the fan control boards, and serving the rack configuration information stored in the fan control boards as local rack configuration information stored in rack management controller.

In accordance with one embodiment of the present invention, the method for automatically managing rack configuration information further includes the following step: when a first fan control board of the fan control boards is new, updating the first fan control board with the local rack configuration information stored in the rack management controller.

In accordance with one embodiment of the present invention, the method for automatically managing rack configuration information further includes the following step: when a first server of the servers is new, updating the first server with the local rack configuration information stored in the rack management controller, or updating the first sever with the rack configuration information stored in one of the fan control boards corresponding to the first sever.

In accordance with one embodiment of the present invention, the method for automatically managing rack configuration information further includes the following step: when the first fan control board or the first server stores another rack configuration information, generating a report according to the another rack configuration information, and then updating the first fan control board or the first server with the local rack configuration information stored in rack management controller.

In accordance with one embodiment of the present invention, the rack configuration information at least comprises rack location information and location information of the servers in a rack of the rack server system.

In summary, by utilizing the embodiments of the present invention, the local rack configuration information stored in the rack management controller can be automatically backed up in the fan control boards or servers, such that the rack management controller can automatically recover the original local rack configuration information while the local rack configuration information is damaged or the rack management controller is replaced. In this manner, the inconvenience of setting the local rack configuration information by hand can be avoided, and the efficiency of troubleshooting of the rack server system can be improved.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

One aspect of the present invention is directed to a rack server system, in which the rack management controller (RMC) inside the rack server system can automatically backup local rack configuration information stored in the rack management controller, such that the rack management controller can automatically recover the original local rack configuration information while the local rack configuration information is damaged or the rack management controller is replaced.

Figure 1:
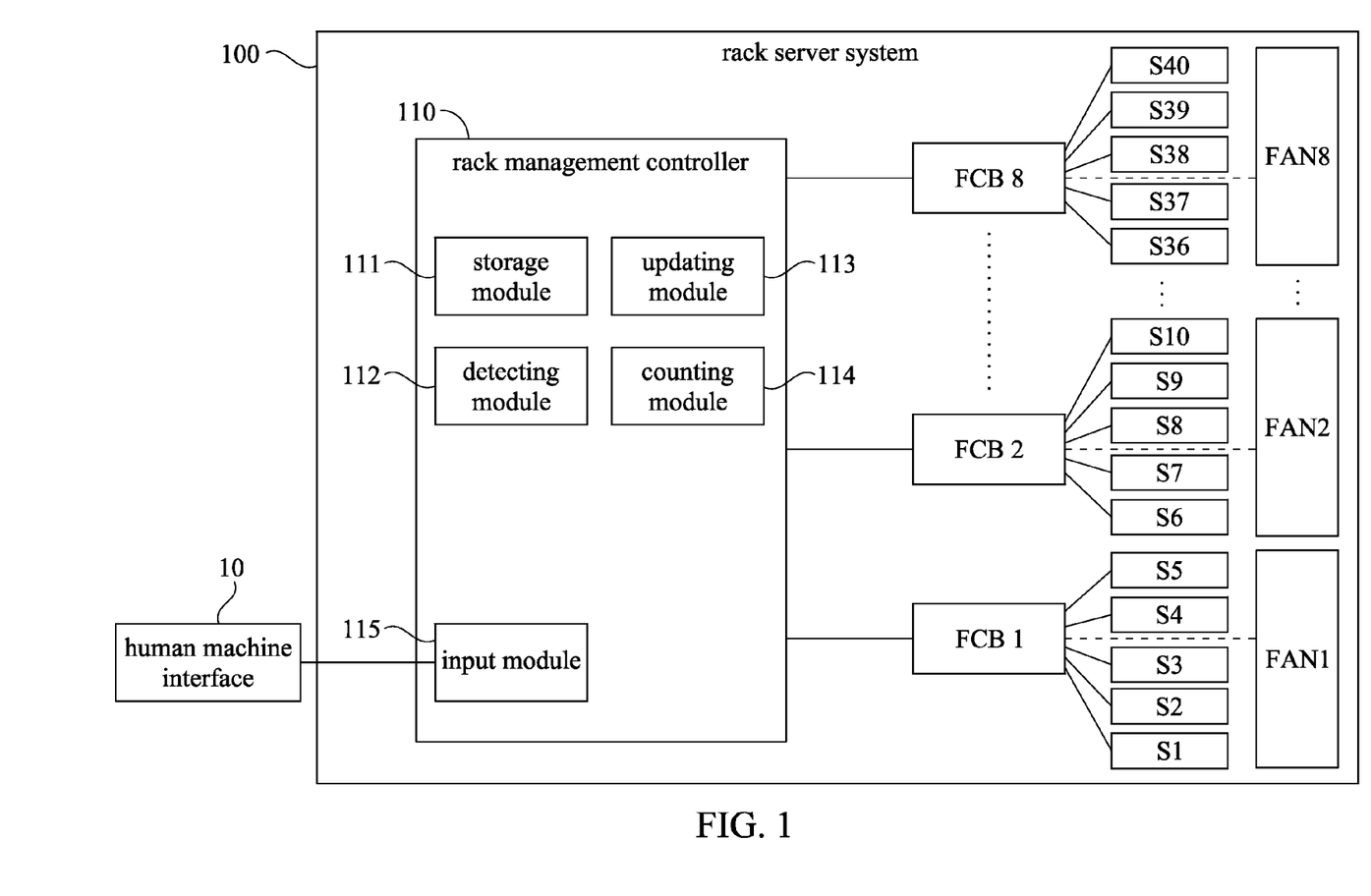
FIG. 1 is a block diagram of a rack server system in accordance with one embodiment of the present invention.

FIG. 1 is a block diagram of a rack server system 100 in accordance with one embodiment of the present invention. The rack server system 100 includes a plurality of servers (e.g., S1-S40), a plurality of fan control boards (FCBs) (e.g., FCB1-FCB8), a plurality of fan modules (e.g., FAN1-FAN8), and a rack management controller (RMC) 110. For the purpose of simplification, in the following descriptive examples, the quantity of the fan control boards is 8 (e.g., FCB1-FCB8), the quantity of the fan modules is 8 (e.g., FAN1-FAN8), and the quantity of the servers is 40 (e.g., S1-S40) are fixed as shown in the diagram. However, in practice, the quantities of the fan control boards, the fan modules, and the servers are not limited by these descriptive examples.

The rack management controller 110 is connected to the fan control boards FCB1-FCB8. The servers S1-S40 are divided into a plurality of groups of servers (e.g., divided into 8 groups). The servers S1-S40 are separately connected to the fan control boards FCB1-FCB8, and are configured to provide the states of servers S1-S40 (e.g., temperatures of servers) to the fan control boards FCB1-FCB8. The fan modules FAN1-FAN8 are respectively connected to the fan control boards FCB1-FCB8, and are configured to respectively dissipate the heat of the groups of the servers. Each of the fan control boards FCB1-FCB8 respectively controls the operation of each of the fan modules FAN1-FAN8 and communicates with each of groups of servers corresponding to each of the fan control boards FCB1-FCB8.

In this embodiment, the rack management controller 110 can backup local rack configuration information stored therein to the fan control boards FCB1-FCB8, and synchronize the local rack configuration information stored therein with corresponding rack configuration information stored in the fan control boards FCB1-FCB8. The local rack configuration information or the rack configuration information may include rack location information and location information for identifying the internal devices of the rack server system 100 (e.g., the rack management controller 110, the fan control boards FCB1-FCB8, and the servers S1-S40). For example, the local rack configuration information or the rack configuration information may include, but not be limited to the model numbers, identification codes, names, IP addresses in the internal network of the rack server system 100 and of the internal devices of the rack server system 100, and the location information and connection of the internal devices of the rack server system 100.

In operation, the rack management controller 110 can detect rack configuration information stored in the fan control boards FCB1-FCB8 during the operation of the rack server system 100. The rack management controller 110 can update local rack configuration information stored in the rack management controller with the rack configuration information stored in the fan control boards FCB1-FCB8 when the local rack configuration information stored in the rack management controller 110 is different from the rack configuration information stored in the fan control boards FCB1-FCB8.

In one embodiment of the present invention, the rack management controller 110 may include a storage module 111, a detecting module 112, and an updating module 113. The storage module 111 of the rack management controller 110 can be used to store the local rack configuration information. The detecting module 112 can be used to detect the local rack configuration information stored in the storage module 111 and the rack configuration information stored in the fan control boards FCB1-FCB8 during the operation of the rack server system 100. When the detecting module 112 detects that the local rack configuration information stored in the rack management controller 110 is different from the rack configuration information stored in the fan control boards FCB1-FCB8, the updating module 113 can be used to update the local rack configuration information stored in the storage module 111 with the rack configuration information stored in the fan control boards FCB1-FCB8.

With the abovementioned operations, if the local rack configuration information stored in the rack management controller 110 is damaged, the rack management controller 110 can recover the local rack configuration information through the fan control boards FCB1-FCB8. In addition, if the rack management controller 110 is replaced by a new rack management controller, the new rack management controller can acquire the rack configuration information stored in the fan control boards FCB1-FCB8 as the local rack configuration information. In such a manner, the inconvenience of setting the local rack configuration information by hand can be avoided, and the efficiency of troubleshooting of the rack server system 100 can be improved.

In one embodiment of the present invention, when the rack management controller 110 has no local rack configuration information, the rack management controller 110 can update itself with the rack configuration information stored in the fan control boards FCB1-FCB8, and serving the rack configuration information stored in the fan control boards FCB1-FCB8 as the local rack configuration information stored in rack management controller 110.

In this embodiment, for achieving the functions abovementioned, the rack management controller 110 may include the storage module 111, the detecting module 112, and the updating module 113 as mentioned before. When the detecting module 112 determines that the storage module 111 has no local rack configuration information, the updating module 113 can update the storage module 111 with the rack configuration information stored in the fan control boards FCB1-FCB8, and serving the rack configuration information stored in the fan control boards FCB1-FCB8 as the local rack configuration information stored in rack management controller 110.

In another embodiment of the present invention, when the local rack configuration information stored in the rack management controller 110 is different from the rack configuration information stored in the fan control boards FCB1-FCB8, the rack management controller 110 can identify a largest quantity of identical rack configuration information stored in the fan control boards FCB1-FCB8, and update the local rack configuration information stored in the rack management controller 110 and the rack configuration information stored in the fan control boards FCB1-FCB8 with the largest quantity of identical rack configuration information found by the rack management controller 110.

For achieving the functions abovementioned, in addition to the storage module 111, the detecting module 112, and the updating module 113 as mentioned before, the rack management controller 110 can further include a counting module 114. When the detecting module 112 determines that the local rack configuration information stored in the storage module 111 is different from the rack configuration information stored in the fan control boards FCB1-FCB8, the counting module 114 can identify the largest quantity of identical rack configuration information stored in the fan control boards FCB1-FCB8, and then the updating module 113 can update the local rack configuration information stored in the rack management controller 110 and the rack configuration information stored in the fan control boards FCB1-FCB8 with the largest quantity of identical rack configuration information found by the counting module 114. For example, if the rack configuration information stored in the fan control boards FCB1-FCB7 are identical and different from the rack configuration information stored in the fan control board FCB8, the updating module 113 would update the local rack configuration information stored in the rack management controller 110 with the rack configuration information stored in the fan control boards FCB1-FCB7, because that the quantity of the identical rack configuration information stored in the fan control boards FCB1-FCB7is more than the quantity of the identical rack configuration information stored in the fan control board FCB8.

In this way, if the local rack configuration information stored in the rack management controller 110 is different from the largest quantity of identical rack configuration information stored in the fan control boards FCB1-FCB8 due to the fact that the rack management controller 110 has been replaced, the new rack management controller 110 can update the local rack configuration information stored in itself with the largest quantity of identical rack configuration information stored in the fan control boards FCB1-FCB8.

On the other hand, in the above embodiment, when the rack management controller 110 can not identify the largest quantity of identical rack configuration information in the fan control boards FCB1-FCB8 or the rack management controller 110 determines that the condition is complex, the rack management controller 110 may receive external input rack configuration information via a human machine interface 10, store the external input rack configuration information, serve the external input rack configuration information as the local rack configuration information, and backup the external input rack configuration information to the fan control boards FCB1-FCB8 as the rack configuration information stored in fan control boards FCB1-FCB8.

For achieving the functions abovementioned, in addition to the storage module 111, the detecting module 112, the updating module 113, and the counting module 114 as mentioned before, the rack management controller 110 can further include an input module 115. When the counting module 114 can not identify the largest quantity of identical rack configuration information in the fan control boards FCB1-FCB8 or the counting module 114 determines that the condition is complex (e.g., the quantity of the different rack configuration information excesses a predetermined threshold), the input module 115 may receive the external input rack configuration information via the human machine interface 10 store it into the storage module 111, and serve the external input rack configuration information as the local rack configuration information. The updating module 113 can backup the external input rack configuration information to the fan control boards FCB1-FCB8 as the rack configuration information stored in fan control boards FCB1-FCB8.

For example, there is a condition that the rack configuration information stored in the fan control boards FCB1-FCB2 are identical and named as the rack configuration information 1, the rack configuration information stored in the fan control boards FCB3-FCB4 are identical and named as the rack configuration information 2, the rack configuration information stored in the fan control boards FCB5-FCB6 are identical and named as the rack configuration information 3, the rack configuration information stored in the fan control boards FCB7-FCB8 are identical and named as the rack configuration information 4, and all of the rack configuration information 1, 2, 3, and 4 are different from each other. In such a condition, the counting module 114 may not identify the largest quantity of identical rack configuration information in the fan control boards FCB1-FCB8 because that all of the quantities of the rack configuration information 1, 2, 3, and 4 are 2. In addition, the counting module 114 may determine that the condition is complex because that the quantity of the different rack configuration information is 4 and excesses the predetermined threshold (e.g., 2). Accordingly, the input module 115 may ask the manager to input rack configuration information, and update all of the rack configuration information with the inputted rack configuration information. It is noted that, the counting module 114 in the embodiment above determines that the condition is complex is due to the fact that the quantity of the different rack configuration information excesses the predetermined threshold, but in practice, the determination of the complex condition can be varied on the basis of actual requirements and is not limited to the manner abovementioned. For instance, the determination can be made relative to whether most of the fan control boards FCB1-FCB8 have no rack configuration information. In addition, the predetermined threshold abovementioned is not limited to 2, but can be other quantities.

In one embodiment of the present invention, the rack management controller 110 can receive external input rack configuration information via the human machine interface 10, and store the external input rack configuration information to the fan control boards FCB1-FCB8 and the servers S1-S40 separately.

In this embodiment, for achieving the functions abovementioned, the rack management controller 110 may include the storage module 111, the updating module 113, and the input module 115 as mentioned before. The input module 115 may receive the external input rack configuration information via the human machine interface 10 and store the external input rack configuration information. The updating module 113 may backup the external input rack configuration information to the fan control boards FCB1-FCB8 and the servers S1-S40. In this way, the manager can in any time input the rack configuration information to the rack server system 100 to adjust the operation of the rack server system 100.

In another embodiment of the present invention, when the rack management controller 110 has no local rack configuration information, and the fan control boards FCB1-FCB8 have no rack configuration information, the rack management controller 110 can receive external input rack configuration information via the human machine interface 10, store the external input rack configuration information as the local rack configuration information, and backup the external input rack configuration information to the fan control boards FCB1-FCB8 and/or to the servers S1-S40.

In this embodiment, for achieving the functions abovementioned, the rack management controller 110 may include the storage module 111, the detecting module 112, the updating module 113, and the input module 115 as mentioned before. When the detecting module 112 detects that the rack management controller 110 has no local rack configuration information and the fan control boards FCB1-FCB8 have no rack configuration information, the input module 115 can receive external input rack configuration information via the human machine interface 10 and store the external input rack configuration information to the storage module 111. The updating module 113 can backup the external input rack configuration information to the fan control boards FCB1-FCB8 as the rack configuration information stored in the control boards FCB1-FCB8 and/or backup the external input rack configuration information to the servers S1-S40.

In one embodiment of the present invention, when one of the fan control boards FCB1-FCB8 (e.g., the fan control board FCB1) is new, the rack management controller 110 can update the new fan control board with the local rack configuration information stored in the rack management controller 110.

In this embodiment, for achieving the functions abovementioned, the rack management controller 110 may include the storage module 111, the detecting module 112, and the updating module 113 as mentioned before. The detecting module 112 can be used to detecting that whether there is a new device in the rack server system 100. If the detecting module 112 identifies that the fan control board FCB1 is new and the fan control board FCB1 has no rack configuration information, the updating module 113 may update the fan control board FCB1 with the local rack configuration information stored in the storage module 111. While if the detecting module 112 identifies that the fan control board FCB1 is new but the fan control board FCB1 already has another rack configuration information, then the rack management controller 110 can acknowledge where the fan control board FCB1 come from based on the another rack configuration information and accordingly generated a report. Consequently, the updating module 113 can update the fan control board FCB1 with the local rack configuration information stored in the storage module 111. In this way, when one of the fan control boards FCB1-FCB8 is replaced, the local rack configuration information can be backed up thereto again.

Similarly, in one embodiment, when one of the servers S1-S40 (e.g., the server S1) is new, the rack management controller 110 can update the new server (e.g., the server S1) with the local rack configuration information stored in the rack management controller 110, or one of the fan control boards FCB1-FCB8 corresponding to the new sever (e.g., the fan control board FCB1) updates the first sever with the rack configuration information stored in the corresponding fan control board FCB1-FCB8.

In this embodiment, for achieving the functions abovementioned, the rack management controller 110 may include the storage module 111, the detecting module 112, and the updating module 113 as mentioned before. The detecting module 112 can be used to detecting that whether there is a new device in the rack server system 100. If the detecting module 112 identifies that the server S1 is new and the server S1 has no rack configuration information, the updating module 113 may update the server S1 with the local rack configuration information stored in the storage module 111, or the fan control board FCB1 may update the server S1 with the rack configuration information stored in the fan control board FCB1. While if the detecting module 112 identifies that the server S1 is new but the server S1 already has another rack configuration information, then the rack management controller 110 can acknowledge where the server S1 come from based on the another rack configuration information and accordingly generated a report. Consequently, the updating module 113 can update the server S1 with the local rack configuration information stored in the storage module 111, or the fan control board FCB1 may update the server S1 with the rack configuration information stored in the fan control board FCB1. In this way, when one of the servers S1-S40 is replaced, the local rack configuration information can be backed up thereto again.

In some embodiments of the present invention, the servers S1-S40 can be connected to external network (i.e., Internet) to maintain the operations of the networks (e.g., domain name servers, DNSs), provide network services (e.g., web servers) or act as data centers (e.g., file servers). In these embodiments, the manager can connect to the servers S1-S40 via the external network, renew the local rack configuration information stored in the rack management controller 110 by the servers S1-S40, and then make the rack management controller 110 backup the renewed local rack configuration information to the fan control boards FCB1-FCB8 as the rack configuration information stored in the fan control boards FCB1-FCB8. In such a configuration, the management of the rack server system 100 can be more convenient.

Moreover, in one embodiment, the fan control boards FCB1-FCB8 can backup part of the content of the rack configuration information (e.g., rotational speed of the fans or the relationship between the fan control boards FCB1-FCB8 and the servers S1-S40) to the servers S1-S40, in which the operations of such a configuration may be similar to or the same as those in the aforementioned embodiments, and hence those would not be repeated again.

It is noted that, the rack management controller 110 and the fan control boards FCB1-FCB8 may respectively be different chips, integrated circuits, programmable logical devices, control devices with ability of computation and storage, or other devices that one skill in the art can easily think of. In addition, the storage module 111, the detecting module 112, the updating module 113, the counting module 114, and the input module 115 as mentioned before are only examples in practice, and the invention is not limited to these exemplary embodiments. The storage module 111 abovementioned may be implemented by memory or other storage media. The detecting module 112, the updating module 113, the counting module 114, and the input module 115 abovementioned may be implemented by hardware or software, determined on the basis of the use condition. In addition, the human machine interface 10 may be an electrical device with equipment for inputting or software with the ability to receive commands.

Another aspect of the present invention is directed to a method for automatically managing rack configuration information. The method can be applied to, but not limited to the rack server system 100 in FIG. 1. The structure of the rack server system the method applies to can be referred to FIG. 1, so it would not be repeated again. In addition, the content of the rack configuration information can be referred to the aspect mentioned above, so it would also not be repeated again.

Figure 2:
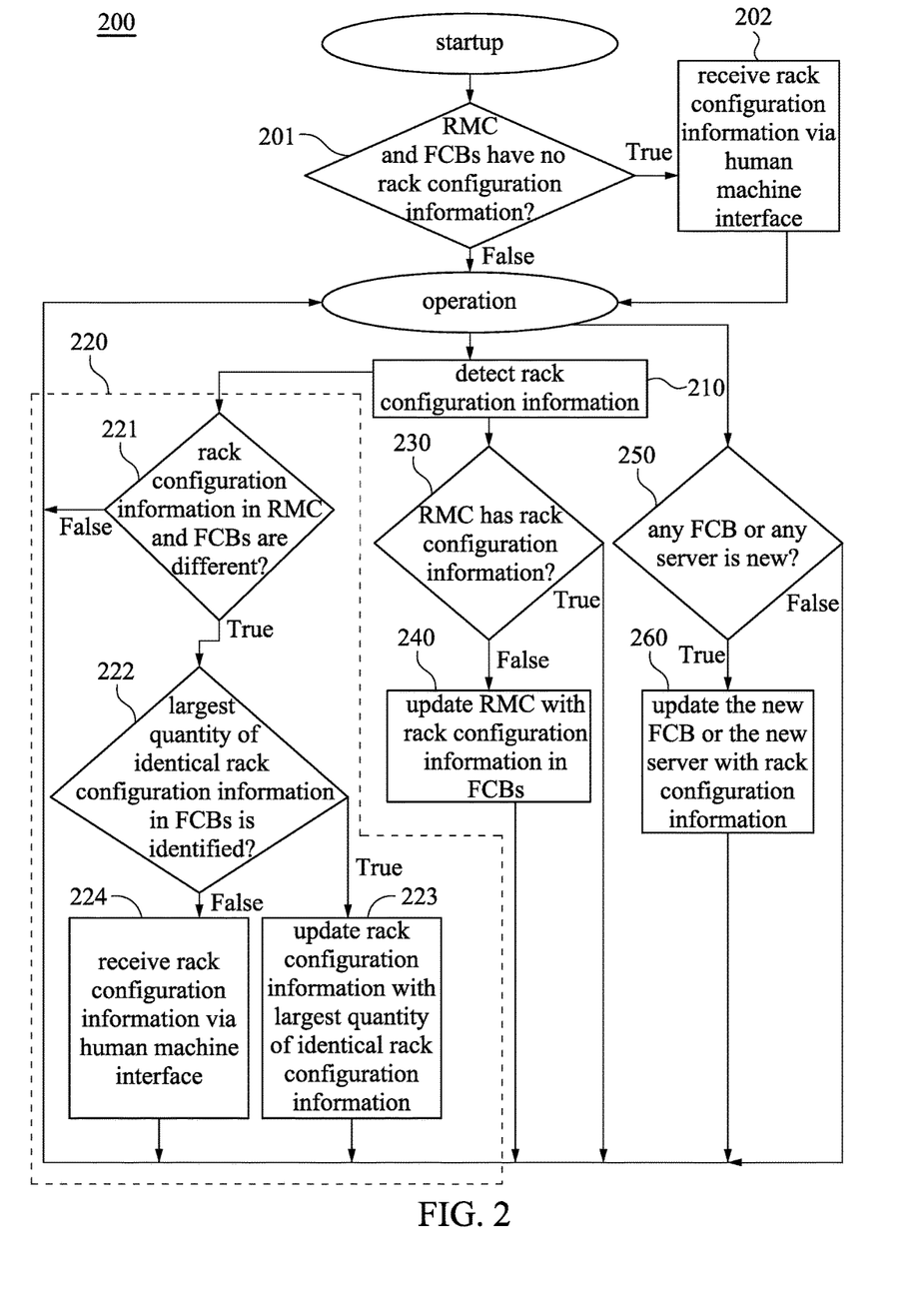
FIG. 2 is a flowchart of the method for automatically managing rack configuration information in accordance with one embodiment of the present invention.

FIG. 2 is a flowchart of the method for automatically managing rack configuration information 200 in accordance with one embodiment of the present invention. For convenience and clarity of explanation, the following description of the method for automatically managing rack configuration information 200 will refer to the rack server system 100 shown in FIG. 1 as an example to interpret the flowchart shown in FIG. 2. The method for automatically managing rack configuration information 200 at least includes the following steps: detecting rack configuration information stored in the fan control boards FCB1-FCB8 during the operation of the rack server system 100 (step 210); and, updating local rack configuration information stored in the rack management controller 110 with the rack configuration information stored in the fan control boards FCB1-FCB8 when the local rack configuration information stored in the rack management controller 110 is different from the rack configuration information stored in the fan control boards FCB1-FCB8 (step 220).

By the steps above, if the local rack configuration information stored in the rack management controller 110 is damaged, the rack management controller 110 can recover the local rack configuration information through the fan control boards FCB1-FCB8. In addition, if the rack management controller 110 is replaced by a new rack management controller, the new rack management controller can acquire the rack configuration information stored in the fan control boards FCB1-FCB8 as the local rack configuration information. In such a manner, the inconvenience of setting the local rack configuration information by hand can be avoided, and the efficiency of troubleshooting of the rack server system 100 can be improved.

In some embodiments of the present invention, the step 220 can include sub-steps 221-224 as following. After the step 210 is performed, the rack management controller 110 can determine whether the rack configuration information stored in the fan control boards FCB1-FCB8 are different from the local rack configuration information stored in the rack management controller 110 (sub-step 221). If the rack configuration information stored in the fan control boards FCB1-FCB8 and the local rack configuration information stored in the rack management controller 110 are the same, then the rack management controller 110 would not react, while if they are different, then the rack management controller 110 may try to identify a largest quantity of identical rack configuration information stored in the fan control boards FCB1-FCB8 (sub-step 222). Consequently, the rack management controller 110 can update the local rack configuration information stored in the rack management controller 110 and the rack configuration information stored in the fan control boards FCB1-FCB8 with the largest quantity of identical rack configuration information (sub-step 223).

On the other hand, in sub-step 222, if the rack management controller 110 can not identify the largest quantity of identical rack configuration information in the fan control boards FCB1-FCB8, then the rack management controller 110 may receive external input rack configuration information via a human machine interface 10 store the external input rack configuration information, serve the external input rack configuration information as the local rack configuration information, and backup the external input rack configuration information to the fan control boards FCB1-FCB8 as the rack configuration information stored in fan control boards FCB1-FCB8 (sub-step 224). Details can be referred to the relevant paragraphs involving the input module 115 and counting module 114 in the aforementioned aspect, and those would not be repeated again.

In some embodiments of the present invention, the method 200 can further include steps 230-240. After the step 210 is performed, the rack management controller 110 can determine whether itself has local rack configuration information (step 240). If the rack management controller 110 has no local rack configuration information, then the rack management controller 110 may be updated with the rack configuration information stored in the fan control boards FCB1-FCB8, and serve the rack configuration information stored in the fan control boards FCB1-FCB8 as the local rack configuration information (sub-step 240).

In one embodiment of the present invention, the rack server system 100 is started for the first time, and all of the rack management controller 110 and the fan control boards FCB1-FCB8 are brand new and have no local rack configuration information and rack configuration information. In this time, the rack management controller 110 may detect the local rack configuration information and the rack configuration information stored in the rack management controller 110 and the fan control boards FCB1-FCB8 respectively, and determine that the rack management controller 110 has no local rack configuration information and the fan control boards FCB1-FCB8 have no rack configuration information (step 201). Consequently, the rack management controller 110 may receive external input rack configuration information via the human machine interface 10, store the external input rack configuration information, and backup the external input rack configuration information to the fan control boards FCB1-FCB8 as the rack configuration information stored in the control boards FCB1-FCB8 and/or backup the external input rack configuration information to the servers S1-S40 (step 202). In this way, the local rack configuration information can be backup to the fan control boards FCB1-FCB8 for recovering the local rack configuration information stored in the rack management controller 110 when local rack configuration information is error or damaged.

It is noted that, the step 202 is not limited to be performed when the rack management controller 110 and the fan control boards FCB1-FCB8 have no local rack configuration information and rack configuration information respectively. That is, in some embodiments, the manager can in any time make the rack management controller 110 receive the external input rack configuration information via the human machine interface 10 and backup the external input rack configuration information to the fan control boards FCB1-FCB8 as the rack configuration information stored in the control boards FCB1-FCB8 and/or backup the external input rack configuration information to the servers S1-S40.

In some embodiments of the present invention, the method for automatically managing rack configuration information 200 may further include step 250 and step 260. That is, during the operation of the rack server system 100, the rack management controller 110 can determine that whether one of the fan control boards FCB1-FCB8 is new (e.g., the fan control board FCB1 is new)(step 250). If the fan control board FCB1 is new, then the fan control board FCB1 can be updated with the local rack configuration information stored in the rack management controller 110 (step 260).

In some other embodiments of the present invention, the method for automatically managing rack configuration information 200 may further include: determining that whether one of the servers is new (e.g., the server S1 is new)(step 250); if the server S1 is new, then updating the server S1 with the local rack configuration information stored in the rack management controller 110, or with the rack configuration information stored in one of the fan control boards FCB1-FCB8 corresponding to the sever S1, (i.e., the fan control board FCB1) (step 260).

By the step 250 and step 260 above, when one of the fan control boards FCB1-FCB8 or servers S1-S40 is replaced, the local rack configuration information can be backed up thereto.

Moreover, in the step 250 and step 260 above, if the new fan control board FCB1 or the new server S1 already has another rack configuration information, then where the fan control board FCB1 or the server S1 come from can be acknowledged based on the another rack configuration information and a report can be generated accordingly. After that, the fan control board FCB1 or the server S1 is updated with the local rack configuration information in the rack management controller 110.

It is noted that, the sequence of all the steps and sub-steps above, in addition to which has been specified, can be adjusted on the basis of actual requirement. In addition, all the steps and sub-steps above can be performed synchronously or partially synchronously. Moreover, the flowchart in FIG. 2 is only an embodiment, and it is not used to limit the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A rack server system, comprising:
   a plurality of servers, divided into a plurality of groups of servers;
   a plurality of fan modules, wherein each fan module dissipates the heat of one of the groups of servers corresponding thereto;
   a plurality of fan control boards, wherein each fan control board controls the operation of one of the fan modules corresponding thereto, and communicates with one of the group of servers corresponding to one of the fan modules; and
   a rack management controller connected to the fan control boards, detecting rack configuration information stored in the fan control boards during the operation of the rack server system, configured to update local rack configuration information stored in the rack management controller with the rack configuration information stored in the fan control boards when the local rack configuration information stored in the rack management controller is different from the rack configuration information stored in the fan control boards,
   wherein when the local rack configuration information stored in the rack management controller is different from the rack configuration information stored in the fan control boards, the rack management controller identifies a largest quantity of identical rack configuration information stored in the fan control boards, and updates the local rack configuration information stored in the rack management controller and the rack configuration information stored in the fan control boards with the largest quantity of identical rack configuration information.

2. The rack server system as claimed in claim 1, wherein the rack management controller receives external input rack configuration information via a human machine interface, and stores the external input rack configuration information to the fan control boards and the servers separately.

3. The rack server system as claimed in claim 1, wherein when the rack management controller do not identify the largest quantity of identical rack configuration information in the fan control boards, the rack management controller receives external input rack configuration information via a human machine interface, stores the external input rack configuration information, and backs up the external input rack configuration information to the fan control boards as the rack configuration information stored in the fan control boards.

4. The rack server system as claimed in claim 1, wherein when the rack management controller has no local rack configuration information, the rack management controller is configured to update itself with the rack configuration information stored in the fan control boards, and serve the rack configuration information stored in the fan control boards as the local rack configuration information stored in rack management controller.

5. The rack server system as claimed in claim 1, wherein when a first fan control board of the fan control boards is new, the rack management controller is configured to update the first fan control board with the local rack configuration information stored in the rack management controller.

6. The rack server system as claimed in claim 5, wherein when a first server of the servers is new, the rack management controller updates the first server with the local rack configuration information stored in the rack management controller, or one of the fan control boards corresponding to the first sever updates the first sever with the rack configuration information stored in the corresponding fan control board.

7. The rack server system as claimed in claim 6, wherein when the rack management controller detects that the first fan control board or the first server stores another rack configuration information, the rack management controller generates a report according to another rack configuration information, and then updates the first fan control board or the first server with the local rack configuration information stored in rack management controller.

8. The rack server system as claimed in claim 1, wherein the rack configuration information at least comprises rack location information and location information of the servers in a rack of the rack server system.

9. A method for automatically managing rack configuration information, applied to a rack server system, wherein the rack server system comprises a plurality of servers, a plurality of fan control boards, and a rack management controller, the servers are separately connected to the fan control boards, the fan control boards are connected to the rack management controller, and the method comprises:
   detecting rack configuration information stored in the fan control boards during the operation of the rack server system; and
   updating local rack configuration information stored in the rack management controller with the rack configuration information stored in the fan control boards when the local rack configuration information stored in the rack management controller is different from the rack configuration information stored in the fan control boards;
   wherein the step of updating the local rack configuration information stored in the rack management controller with the rack configuration information stored in the fan controllers comprises:
   when the local rack configuration information stored in the rack management controller is different from the rack configuration information stored in the fan control boards, identifying a largest quantity of identical rack configuration information stored in the fan control boards; and
   updating the local rack configuration information stored in the rack management controller and the rack configuration information stored in the fan control boards with the largest quantity of identical rack configuration information.

10. The method as claimed in claim 9, further comprising:
    receiving external input rack configuration information via a human machine interface, and storing the external input rack configuration information to the fan control boards and the servers separately.

11. The method as claimed in claim 9, wherein the step of updating the local rack configuration information stored in the rack management controller with the rack configuration information stored in the fan controllers further comprises:

when the largest quantity of identical rack configuration information in the fan control boards is not found, receiving external input rack configuration information via a human machine interface and storing the external input rack configuration information; and backing up the external input rack configuration information to the fan control boards as the rack configuration information stored in the fan control boards.

12. The method as claimed in claim 9, further comprising:

when the rack management controller has no local rack configuration information, updating the rack management controller with the rack configuration information stored in the fan control boards, and serving the rack configuration information stored in the fan control boards as local rack configuration information stored in rack management controller.

13. The method as claimed in claim 9, further comprising:

when a first fan control board of the fan control boards is new, updating the first fan control board with the local rack configuration information stored in the rack management controller.

14. The method as claimed in claim 9, further comprising:

when a first server of the servers is new, updating the first server with the local rack configuration information stored in the rack management controller, or updating the first sever with the rack configuration information stored in one of the fan control boards corresponding to the first sever.

15. The method as claimed in claim 14, further comprising:

when the first fan control board or the first server stores another rack configuration information, generating a report according to the another rack configuration information, and then updating the first fan control board or the first server with the local rack configuration information stored in rack management controller.

16. The method as claimed in claim 9, wherein the rack configuration information at least comprises rack location information and location information of the servers in a rack of the rack server system.

* * * * *